(12) United States Patent
Frosien et al.

(10) Patent No.: US 7,679,054 B2
(45) Date of Patent: Mar. 16, 2010

(54) DOUBLE STAGE CHARGED PARTICLE BEAM ENERGY WIDTH REDUCTION SYSTEM FOR CHARGED PARTICLE BEAM SYSTEM

(75) Inventors: Jürgen Frosien, Riemerling (DE); Ralf Degenhardt, Landsham (DE); Stefan Lanio, Erding (DE)

(73) Assignee: ICT Integrated Circuit Testing Gesellschaft für Halbleiterprüftechnik mbH, Heimstetten (DE)

( * ) Notice: Subject to any disclaimer, the term of this patent is extended or adjusted under 35 U.S.C. 154(b) by 736 days.

(21) Appl. No.: 10/571,347

(22) PCT Filed: Sep. 2, 2004

(86) PCT No.: PCT/EP2004/009801

§ 371 (c)(1),
(2), (4) Date: Jan. 10, 2007

(87) PCT Pub. No.: WO2005/024888

PCT Pub. Date: Mar. 17, 2005

(65) Prior Publication Data

US 2007/0200069 A1      Aug. 30, 2007

(30) Foreign Application Priority Data

| Sep. 11, 2003 | (EP) | .................................. 03020710 |
| Sep. 11, 2003 | (EP) | .................................. 03020711 |
| Dec. 16, 2003 | (EP) | .................................. 03028696 |

(51) Int. Cl.
*H01J 49/00* (2006.01)

(52) U.S. Cl. .................. 250/296; 250/281; 250/282; 250/294; 250/305; 250/396 R

(58) Field of Classification Search ............. 250/281, 250/282, 290, 292, 293, 294, 295, 296, 298, 250/305, 396 R, 396 ML
See application file for complete search history.

(56) References Cited

U.S. PATENT DOCUMENTS 4,553,029 A   11/1985   Matsuda (Continued)

FOREIGN PATENT DOCUMENTS

DE          19633496 A1     2/1998

(Continued)

OTHER PUBLICATIONS

W.H.J. Andersen et al., "A double wienfilter as a high resolution, high transmission electron energy analyser," Journal of Physics E. Scientific Instruments, IOP Publishing, Bristol, 1970 vol. 3(3): pp. 121-126.

(Continued)

*Primary Examiner*—Jack I Berman
*Assistant Examiner*—Hanway Chang
(74) *Attorney, Agent, or Firm*—Patterson & Sheridan, LLP

(57) ABSTRACT

The present invention relates to e.g. a charged particle beam energy width reduction system for a charged particle beam with a z-axis along the optical axis and a first and a second plane, comprising, a first element acting in a focusing and dispersive manner, a second element acting in a focusing and dispersive manner, a first quadrupole element being positioned such that, in operation, a field of the first quadrupole element overlaps with a field of the first element acting in a focusing and dispersive manner, a second quadrupole element being positioned such that, in operation, a field of the second quadrupole element overlaps with a field of the second element acting in a focusing and dispersive manner, a first charged particle selection element being positioned, in beam direction, before the first element acting in a focusing and dispersive manner, and a second charged particle selection element being positioned, in beam direction, after the first element acting in a focusing and dispersive manner. Thereby, a virtually dispersive source-like location without an inherent dispersion limitation can be realized.

33 Claims, 10 Drawing Sheets

U.S. PATENT DOCUMENTS

| | | | |
|---|---|---|---|
| 4,924,090 A * | 5/1990 | Wollnik et al. | 250/296 |
| 4,962,313 A | 10/1990 | Rose | |
| 5,198,674 A | 3/1993 | Underwood | |
| 6,410,924 B1 | 6/2002 | Wang | |
| 6,489,621 B1 | 12/2002 | Frosien | |
| 6,614,026 B1 * | 9/2003 | Adamec | 250/398 |
| 2002/0104966 A1 * | 8/2002 | Plies et al. | 250/311 |
| 2004/0188630 A1 | 9/2004 | Brunner et al. | |

FOREIGN PATENT DOCUMENTS

| | | |
|---|---|---|
| DE | 10122957 A1 | 11/2002 |
| EP | 0373399 A2 | 6/1990 |
| EP | 1432006 A2 | 6/2004 |
| JP | 2000-100361 | 4/2000 |
| JP | 2000-113845 | 4/2000 |
| WO | WO-00/36630 | 6/2000 |

OTHER PUBLICATIONS

Harald Rose et al., "Electron Optics of Imaging Energy Filters," Springer Series in Optical Sciences, Springer, Berlin, 1995 vol. 71: pp. 43-55.

European Examination Report dated Jul. 6, 2006.

X.D. Liu et al., "Aberration analysis of Wien filters and design of an electron energy-selective imaging system," Nuclear Instruments and Methods in Physics Research A, Sep. 1995 vol. 363(1): pp. 254-260.

Japanese Office Action for Patent Application No. 2006-525710 dated Mar. 10, 2009. (ZIMR/0035).

* cited by examiner

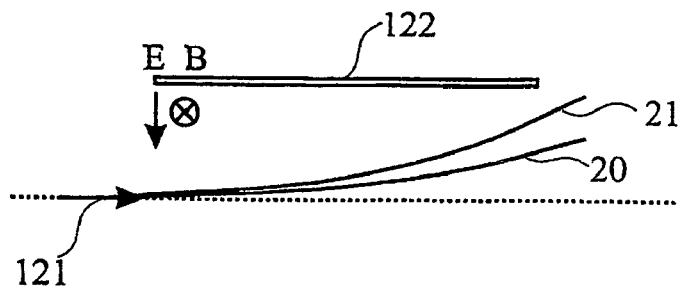
Fig. 12a
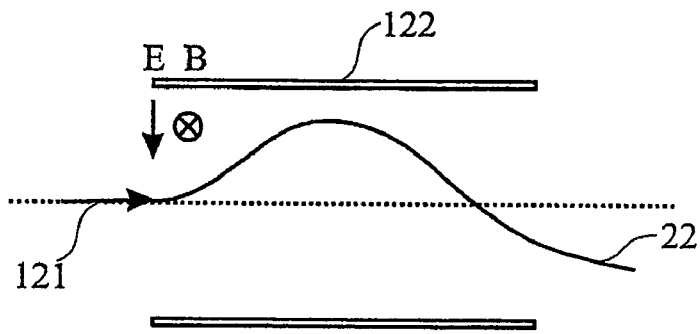
Fig. 12b
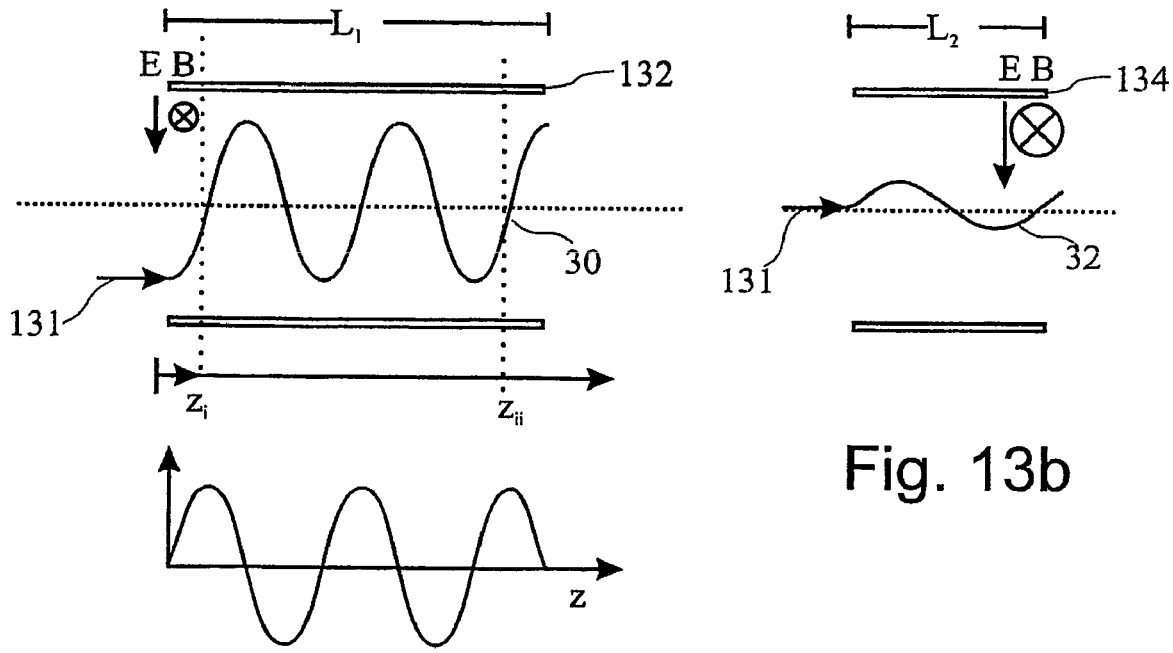
Fig. 13b
Fig. 13a

DOUBLE STAGE CHARGED PARTICLE BEAM ENERGY WIDTH REDUCTION SYSTEM FOR CHARGED PARTICLE BEAM SYSTEM

CROSS-REFERENCE TO RELATED APPLICATIONS

This application claims foreign priority benefits under 35 U.S.C. 119 to co-pending European patent application numbers EP 03020711.2, filed Sep. 11, 2003, EP 03020710.4, filed Sep. 11, 2003, and EP 03028696.7, filed Dec. 16, 2003. These related patent applications are herein incorporated by reference in their entireties.

FIELD OF THE INVENTION

The invention relates to charged particle beam devices for inspection system applications, testing system applications, lithography system applications and the like. It also relates to methods of operation thereof. Further, the present invention relates to charged particle selection systems. Specifically, the present invention relates to charged particle beam devices and methods of using a charged particle beam energy width reduction system.

BACKGROUND OF THE INVENTION

Charged particle beam apparatuses have many functions in a plurality of industrial fields, including, but not limited to, inspection of semiconductor devices during manufacturing, exposure systems for lithography, detecting devices and testing systems. Thus, there is a high demand for structuring and inspecting specimens within the micrometer and nanometer scale.

Micrometer and nanometer scale process control, inspection or structuring, is often done with charged particle beams, e.g. electron beams, which are generated and focused in charged particle beam devices, such as electron microscopes or electron beam pattern generators. Charged particle beams offer superior spatial resolution compared to, e.g. photon beams due to their short wavelengths.

However, in modern low voltage electron microscopes, aberrations limit the achievable resolution to approximately 3 nm for 1 keV electron energy. Especially for low energy application, it is therefore desirable to reduce chromatic aberrations. The diameter of the aberration disc of the chromatic aberration in the Gaussian image plane of an objective is proportional to the relative energy width $\Delta E/E$ of the charged particle beam.

The electrons in an electron beam column are not monochromatic because of the emission process and the Boersch effect, that is, the broadening of the energy distribution because of stochastic Coulomb interaction so that the relative energy width is increased. In view of the above, the energy width $\Delta E$ amounts to approximately 0.5 to 1 eV or even higher, in dependence upon the beam current.

A further minimization of the chromatic aberration based on the focusing properties of, for example, the objective lens is difficult. For this reason, it is already known to utilize monochromators, in order to further increase the resolution. Thereby, the energy width $\Delta E$ of the electron beam, which is processed subsequently by the downstream electron-optical imaging system, can be reduced.

Wien filters are known as monochromators for charged particles wherein an electrostatic dipole field and a magnetic dipole field are superposed perpendicularly to each other.

As an example, patent publication U.S. Pat. No. 6,489,621 (Frosien et al.) shows a device for reducing the energy width of a particle beam with a $1^{st}$ and a $2^{nd}$ Wien filter for dispersing the particle beam depending on the energy of the particles, and an aperture for selecting the particles within a certain reduced energy width. Thereby, a disadvantageous crossover can be avoided for small dispersion values.

However, there is a necessity for a system suitable for an increased dispersion of a charged particle beam energy width reduction system.

SUMMARY OF THE INVENTION

The present invention provides an improved charged particle system. Thereby, the resolution of the system is intended to be improved. According to aspects of the present invention, a charged particle beam velocity distribution width reduction system according to independent claim 1, a charged particle beam device according to independent claim 19 and a method of operating a charged particle beam velocity distribution width reduction system according to independent claim 22 are provided.

Further advantages, features, aspects and details of the invention are evident from the dependent claims, the description and the accompanying drawings.

According to one aspect, a charged particle beam energy width reduction system with a z-axis along the optical axis and a first and a second plane is provided. The system comprises a first element acting in a focusing and dispersive manner, a second element acting in a focusing and dispersive manner, a first quadrupole element being positioned such that, in operation, a field of the first quadrupole element overlaps (superimposes) with a field of the first element acting in a focusing and dispersive manner, a second quadrupole element being positioned such that, in operation, a field of the second quadrupole element overlaps with a field of the second element acting in a focusing and dispersive manner, a first charged particle selection element being positioned, in beam direction, before the first element acting in a focusing and dispersive manner, and a second charged particle selection element being positioned, in beam direction, after the first element acting in a focusing and dispersive manner.

According to another aspect, the charged particle beam energy width reduction system is provided, whereby the first element acting in a focusing and dispersive manner is a first Wien filter element and the second element acting in a focusing and dispersive manner is a second Wien filter element.

Within the present application, instead of a Wien filter element, also other elements acting in a focusing and dispersive manner in one plane can be used. Thereby, as an example, elements with a curved optical axis can be used.

Further, within this application the disclosed energy width reduction element is also denoted as a monochromator. The term monochromator in the present application is not to be understood as selecting a single energy of the charged particles, but as filtering the charged particle beam to obtain a desired energy width.

The above-mentioned aspects give the possibility to provide an improved energy width reduction system and an improved charged particle beam device. On the one hand, the dispersion of the system can be increased beyond a limit of state of the art devices. On the other hand, the virtual source of dispersion can be advantageously positioned along the z-axis. Thereby, the virtual source of dispersion can be positioned at essentially the position of the source-like location. Thus, the source like location and the virtual source of dispersion coincide with one another. In addition, the source-like location can be positioned along the z-axis with the two quadrupoles. The virtual source of dispersion may follow this positioning so that, preferably, the source like location and the virtual source of dispersion coincide with one another.

According to the above aspect, charged particles with different energies are separated due to the dispersion introduced. However, going into more detail, it can be found that a selection is conducted based on the velocity of the charged particles. The velocity is given by equation 1.

$$v=\text{sqrt}(2E/m) \quad (1)$$

Thereby, v is the velocity (non-relativistic), sqrt represents the square root, E is the energy of the charged particles, and m is the mass of the charged particles. Alternatively, equation (1) can be written as:

$$v=\text{sqrt}(2qU/m) \quad (2)$$

Thereby, q is the charge of a particle and U the acceleration potential. The above-mentioned aspect relates to an energy dependent selection for particles with a constant mass, as for example electrons.

Nevertheless, the apparatus according to one aspect of the present invention can also be used for mass spectrometry of charge particles. A variation of the velocity v results in a separation of different elements with different masses or different isotopes of one element. This variation is large enough to ignore the energy variation of e.g. 1 eV at an energy of e.g. 1 keV, which corresponds to a relative energy width of 1e-3.

In view of the above, the energy width reduction described can be generally applied to a velocity distribution width reduction. The velocity distribution width reduction is, according to equation 1, either an energy width reduction or a mass distribution width reduction. Since the mass distribution generally has discrete values, the mass distribution width reduction can also be considered a mass selection.

With respect to the mass selection, a further advantage of the present invention can be described. State of the art mass spectrometers making use of e.g. Wien filters have the problem that based on the focusing effect of the Wien filters, which results in an elliptical shaped beam after the mass selection. The focusing effect of the beam filter is compensated, or almost compensated for, within the present invention. Thus, the disadvantage of elliptical beams after mass selection can be avoided.

As described above, the velocity distribution width reduction can either be an energy width reduction or a mass selection. Consequently, regarding the aspects of the subject invention, a velocity distribution width reduction system can either be an energy width reduction system or a mass selection system. Further, a velocity dependent selection element can either be an energy dependent selection element or a mass dependent selection element.

According to an aspect systems can be provided, whereby the charged particles have the same mass; and the charged particle beam velocity distribution width reduction system is used as a charged particle beam energy width reduction system. According to another aspect, systems can be provided, whereby the charged particles have a different mass; and the charged particle beam velocity distribution width reduction system is used as a charged particle beam mass selection system.

In the following, for easier exploration, it is referred to as an energy width reduction. However, the described aspects, details, and embodiments can also be utilized for mass selection of charge particles. Thus, generally, the described aspects, details, and embodiments can be used for a velocity distribution width reduction.

According to another aspect, a charged particle beam energy width reduction system is provided, whereby the first element acting in a focusing and dispersive manner and the first quadrupole element have a position with respect to a source-like location so that the charged particles pass through a non-focusing region with a length of between 10 mm and 300 mm.

Thus, typically, it is possible to provide the inventive system close to the charged particle source.

According to further aspects, it is either possible that the second charged particle selection element is positioned between the first element acting in a focusing and dispersive manner and the second element acting in a focusing and dispersive manner, or that the second charged particle selection element is positioned, in beam direction, after the second element acting in a focusing and dispersive manner.

Thereby, the position of the second charged particle selection element can be chosen dependent on the requirements of the optical system involved.

According to another aspect, a charged particle beam energy width reduction system is provided, whereby the source-like location is a charged particle source or a virtual particle source, or whereby the source-like location is a cross-over, or whereby the source-like location is an image of a charged particle source, or a virtual source.

Thus, the energy width reduction system can be used at different positions within the charged particle beam device. Nevertheless, the advantageous positioning of the virtual source of dispersion can be applied to all of these possibilities.

According to another aspect, the above-mentioned charged particle beam energy width reduction systems can be applied for an charged particle beam device. Thereby, the features mentioned above, can also be used for the charged particle beam device.

According to another aspect, the energy width reduction system is directly positioned behind the electron source or, in the case where for example extraction means are part of a charged particle gun component, directly behind or even within the charged particle gun component.

According to another aspect, a method of operating a charged particle beam energy width reduction system is provided. The system has a z-axis along an optical axis, a first element acting in a focusing and dispersive manner, a second element acting in a focusing and dispersive manner, and a first quadrupole element and a second quadrupole element. The method comprises the steps of: shape the charged particle beam with a first charged particle selection element, exciting the first element acting in a focusing and dispersive manner and the second element acting in a focusing and dispersive manner so that, in a first plane, the charged particles seem to originate from a source-like location by the combination of a field of the first element acting in a focusing and dispersive manner, a first quadrupole element field, a field of the second element acting in a focusing and dispersive manner, and a second quadrupole element field, exciting the first and the second quadrupole element so that the field of the first quadrupole element and the field of the second quadrupole element image the charged particle beam in a second plane to virtually come from a source-like location, and selecting energy dependently the charged particles with the second charged particle selection element.

Thereby, it can be avoided that the source like location is enlarged due to the dispersion introduced in the system and, on the other hand, dispersion limits of prior art systems can be overcome.

According to another aspect, a method of operating a charged particle beam energy width reduction system is provided, whereby the first element acting in a focusing and dispersive manner is a first Wien filter element and the second element acting in a focusing and dispersive manner is a second Wien filter element.

According to another aspect, the method is provided, whereby the first and the second quadrupole elements and the first and the second elements acting in a focusing and dispersive manner are excited to one of a plurality of discrete values.

Furthermore, method steps required to operate, implement, or manufacture any detail of the above described apparatuses can be used for the methods mentioned above.

With respect to the above aspects describing methods and apparatuses, typically, the z-axis extends along the optical axis that may be curved.

The invention is also directed to apparatus for carrying out the disclosed methods, including apparatus parts for performing each of the described method steps. These method steps may be performed by way of hardware components, a computer programmed by appropriate software, by any combination of the two, or in any other manner.

BRIEF DESCRIPTION OF THE DRAWINGS

Some of the above indicated and other more detailed aspects of the invention, will be described in the following description and partially illustrated with reference to the figures. Therein:

FIG. 4 shows a schematic side view in the y-z-plane of which corresponds to

FIG. 3;

FIGS. 12a to 13b show schematic side views of Wien filters and excitation conditions.

DETAILED DESCRIPTION OF THE DRAWINGS

Figure 1:
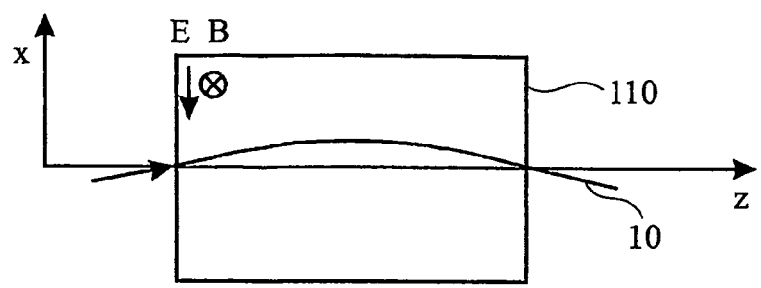
FIG. 1 shows a schematic side view in the x-z-plane of a Wien filter and an exemplary beam path of an electron beam entering the Wien filter.

Without limiting the scope of protection of the present application, in the following the charged particle beam device or components thereof will exemplarily be referred to as an electron beam device or components thereof. Thereby, the electron beam might especially be utilized for inspection or lithography. The present invention can still be applied for apparatuses and components using other sources of charged particles and/or other secondary and/or backscattered charged particles to obtain a specimen image.

Those skilled in the art would also appreciate that all discussions herein related to e.g. an x-z- or an y-z-plane are to be understood that the planes are essentially perpendicular to each other. Even though theoretical discussions in this application refer to coordinates in a mathematical sense, the respective components can practically be positioned with respect to each other so that the x-z- and y-z-plane enclose an angle of about 80° to 100°, preferably 87° to 93°, more preferably of about 89° to 91°.

Further, without limiting the scope of protection of the present application, in the following, the charged particle beams will be referred to as primary charged particle beams. The present invention might still be used for secondary and/or backscattered charged particles. Thereby, for example, the energy distribution of charged particles in an imaging optics can be controlled.

Within the following description of the drawings the same reference numbers refer to the same components. Generally, only the differences with respect to the individual embodiments are described.

With reference to FIGS. 12 and 13, some principles of the Wien filter will now be described. FIG. 12a shows a Wien filter element 122 and its influence on a charged particle 121. The dipole Wien filter comprises an electrostatic field E and the magnetic field B. The fields are perpendicular with respect to each other. The charged particle, which is indicated by arrow 121, has a non-nominal energy. Only charged particles with the nominal energy would be allowed to pass straight through the Wien filter. Thus, the non-nominal energy charged particle 121 is deflected from the optical axis. This results in a charged particle beam 20.

A diagram like the one shown in FIG. 12a can be found in many textbooks. In practice, it is relevant to further increase the excitation of the Wien filter. An example therefore is shown in FIGS. 12a and 12b. Starting to increase the excitation, the excitation leads to an increased deflection angle, as indicated by charged particle beam 21. However, if the excitation of Wien filter 122 is further increased the charged particle beam reaches a limiting deflection angle. A further increase diminishes the deflection angle (see FIG. 12b). The charge particles are deflected towards the optical axis. Thus, even though the excitation is increased, the deflection angle is not increased beyond a certain limit. Yet, this deflection angle is necessary for the energy dependent charged particle selection.

This might be better understood with reference to FIG. 13a. FIG. 13a shows a Wien filter 132 having a length $L_1$ along the optical axis (z-axis). An incoming charged particle 131 is imaged due to the electrostatic field and magnetic field. The Wien filter has, additionally to its dispersive properties, imaging properties. The diagram below shows the deflection angle versus the z-position. For position $z_i$ and position $z_{ii}$ the angles are approximately similar. Thus, not the entire excitation could be used to have an increased separation between charged particles of different energy.

The term excitation might be better understood when comparing FIGS. 13a and 13b. The Wien filter of FIG. 13b has the shorter length $L_2$. However, the beam path 32 is comparable to the beam path 30. This is realized by having higher field strengths within Wien filter 134, which is indicated by the larger field symbols. The excitation can be considered to be the product from the length of the Wien filter and the field strengths.

Thus, the dispersion of a Wien filter is inherently limited by the focusing effect of the Wien filter. But even for small excitations, referred to in U.S. Pat. No. 6,489,621 problems might occur, as can be seen from FIGS. 4 and 5, in U.S. Pat. No. 6,489,621. Having small enough excitations to neglect the focusing effect of the Wien filter element, as in U.S. Pat. No. 6,489,621, the dispersion of a Wien filter seems to originate from the center of the filter. That is, the center of the Wien filter is the virtual point of dispersion. Thereby, however, without additional focusing means, a point source, wherefrom the charged particles originate, seems to be increased in size due to the dispersion. Thereby, the resolution of the system is decreased.

In view of the above, it is desirable to provide a dispersive element without an inherent limit of dispersion and with a virtual point of dispersion that is not located in the center of the dispersive element. An additional crossover in the x-z-plane and the y-z-plane at a common z-position is avoided.

Figure 2:
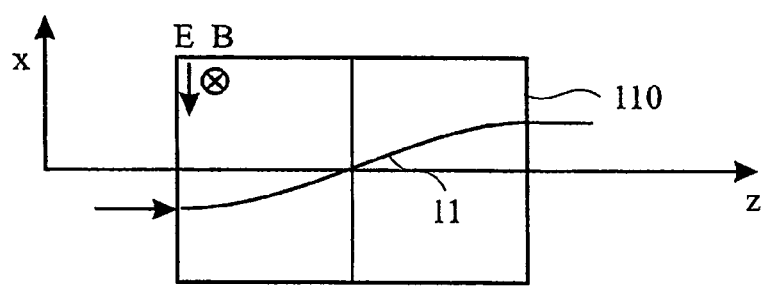
FIG. 2 shows a schematic side view in the x-z-plane of a Wien filter and another exemplary beam path of an electron beam entering the Wien filter.

FIG. 1 shows a view in the x-z-plane of the Wien filter 110. A charged particle, for example an electron, which enters the Wien filter 110 under an angle, follows beam path 10. The same system is shown in FIG. 2. A different electron entering the Wien filter 110 parallel to the optical axis with an offset thereto, follows e.g. beam path 11. Both of the above described beam paths 10 and 11 are generated due to the focusing action of the Wien filter 110 in the x-z-plane. As described above, this focusing action in the x-z-plane results in an upper limit for the deflection angle in the case of an increasing excitation.

Figure 3:
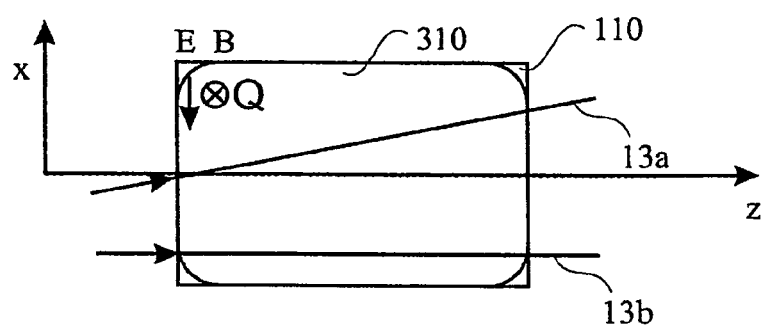
FIG. 3 shows a schematic side view in the x-z-plane of a Wien filter element and a quadrupole element and two exemplary beam paths of electron beams entering the system.

FIG. 3 shows a system, wherein the field of the Wien filter is overlaid with the field of a quadrupole element 310. The quadrupole element is arranged to have a defocusing effect in the x-z-plane. The excitation of the quadrupole element 310 is chosen so that the defocusing effect thereof and the focusing effect of the Wien filter 110 negate each other. Thus, electrons entering the optical system 110/310 do not experience any focusing action in the x-z-plane. As shown in FIG. 3 the particles pass straight through the system as indicated by beam paths 13a and 13b.

Figure 4:
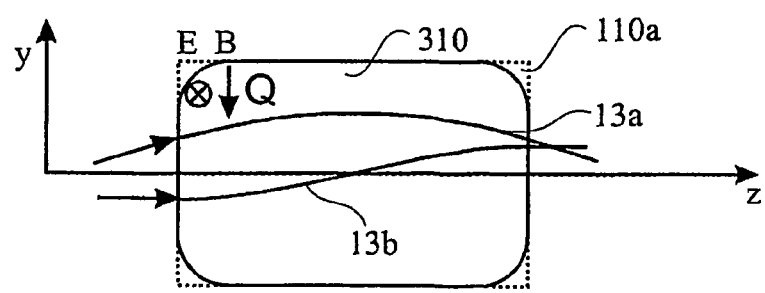

The effect of the combined Wien filter-quadrupole element optical system in the y-z-plane is explained with reference to FIG. 4. Wien filter 110a is drawn with dotted lines. The dotted lines indicate that the dipole Wien filter does not have any effect on the electrons in the y-z-plane. Consequently, the electrons, in the y-z-plane, are only influenced by the quadrupole element. The quadrupole element 310, which has a defocusing effect in the x-z-plane, has a focusing effect in the y-z-plane. Exemplary beam paths, 13a and 13b can be seen in FIG. 4.

As described above, the combination of the Wien filter 110 and the quadrupole 310 and can be arranged so that there is no resulting focusing effect in the x-z-plane. Thus, the excitation and can be further increased without having an imaging scheme as e.g. shown in FIG. 13a. Nevertheless, the Wien filter element 110 introduces a dispersion for electrons with a non-nominal energy. Thus, the excitation can be increased far beyond the limit that is given by the focusing effect of the Wien filter (see FIGS. 12a to 13b).

Figure 5A:
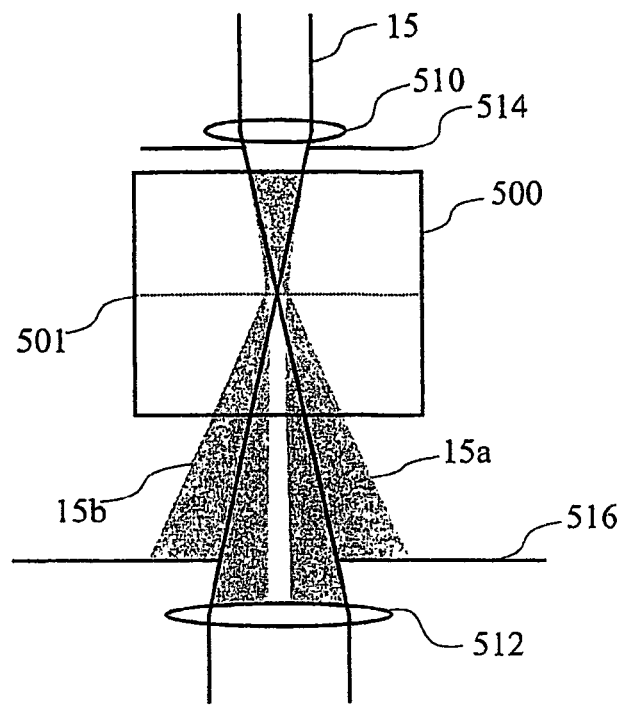
FIGS. 5a and 5b show schematic side views in the x-z-plane and in the y-z-plane, respectively, of an embodiment with an improved Wien filter.
Figure 5B:
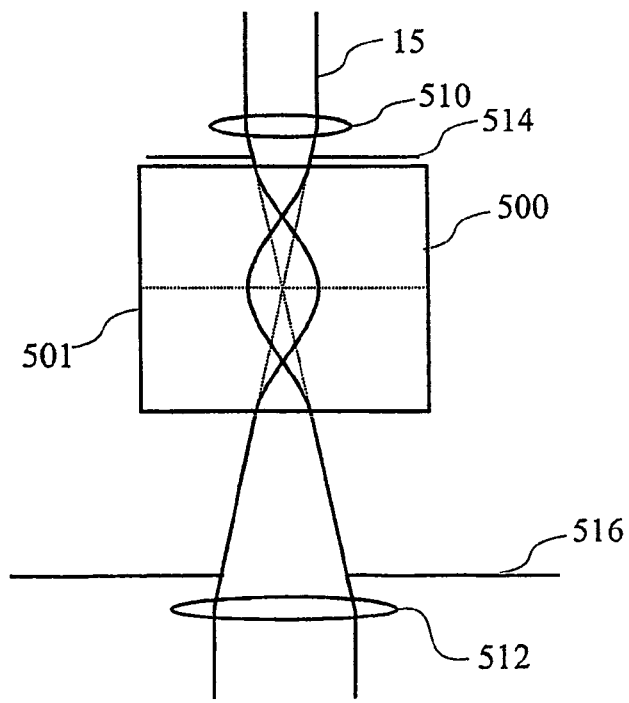

An embodiment utilizing the above-described effect will now be described with reference to FIGS. 5a and 5b. FIG. 5a shows a single stage electron energy width reduction system in the x-z-plane, whereas FIG. 5b shows the same system in the y-z-plane. The system comprises a first lens 510, which focuses the electron beam 15. An electron selection means 514 blocks a portion of the electron beam. Thereby, an electron beam with a defined shape is generated.

The shaped electron beam enters a combined Wien filter-quadrupole element system 500. For imaging reasons system 500 is positioned so that the center 501 of the system is essentially positioned at the crossover of electron beam 15. The Wien filter-quadrupole element system 500 does not have any imaging effect on the electrons in x-direction. Therefore, electrons with the nominal energy $E_n$ pass undeflected through the system. However, electrons with an energy deviating from the nominal energy $E_n$ are influenced by the dispersion introduced by the Wien filter. Depending on whether the energy of these electrons is below or above the nominal energy $E_n$, these electrons are deflected according to beams 15a or 15b. Below the optical system 500 there is a second electron selection means 516. The aperture of this selection means is formed so that electrons with the nominal energy or electrons with an allowed energy deviation can pass through the electron selection means and are not blocked. Portions of the electrons with an energy deviating from the nominal energy $E_n$ (see 15a, 15b) are blocked by the electron selection means. The aperture means 516 located behind optical system 500 can be considered an electron energy dependent selection means because of the capability to block electrons which energy deviates from $E_n$. Electrons, which pass through the aperture of the electron energy dependent selection means 516, are imaged by lens 512.

The beam path through the optical system 500 will now be described in the y-z-plane. The first lens 510, the first electron selection element 514, the combined Wien filter-quadrupole element system 500, the second electron selection element 516 and the second lens 512 have already been described with respect to FIG. 5a. Different from FIG. 5a, the view in the y-z-plane (see FIG. 5b) images electron beam 15 due to the focusing action of the quadrupole element in y-direction. However, there exist a plurality of defined excitation levels, imaging the electron beam 15 in the y-z-plane so that there is virtually no focusing effect.

The electron beam appears to originate from the x-y-center-plane 501 of the system 500. The virtual origin of the electron beam is the crossover, which would be generated by lens 510 if no fields would be present in system 500.

Figure 6A:
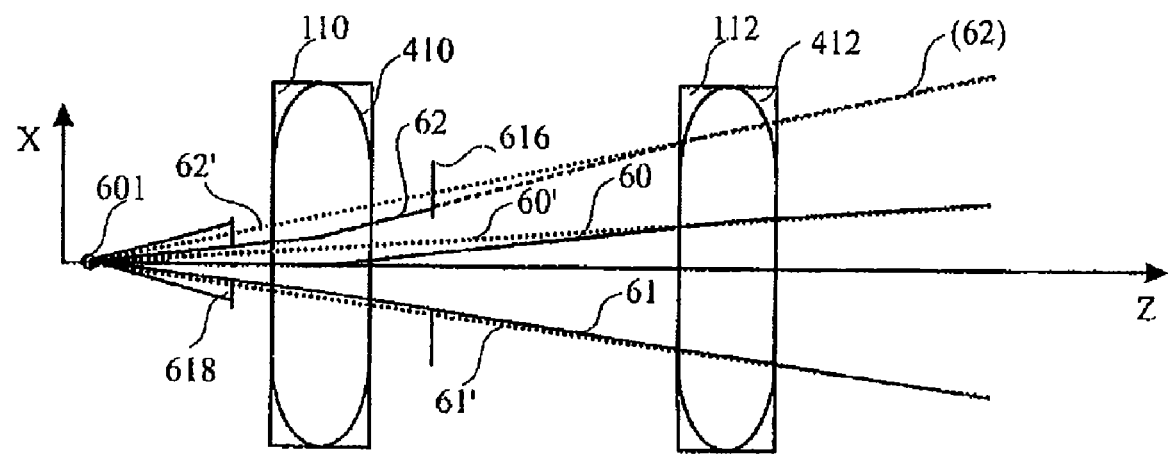
FIGS. 6a and 6b show schematic side views in the x-z-plane and in the y-z-plane, respectively, of an embodiment of a charged particle beam energy width reduction system according to the present invention.
Figure 6B:
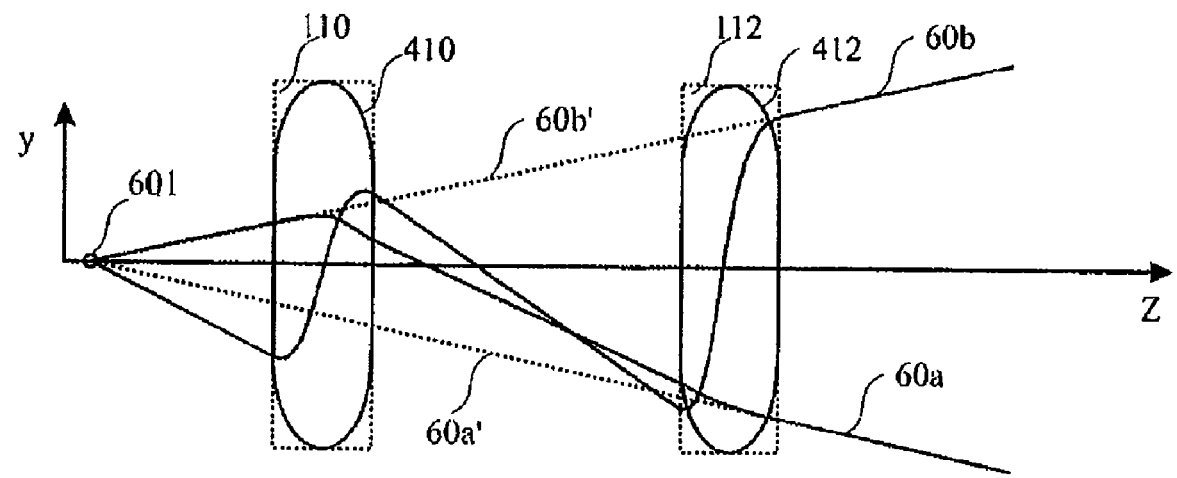

In order to avoid the crossover in the x-z-plane and the y-z-plane at a common z-position, the present invention provides an improved solution. Thereby, the Boersch effect, which increases the energy width of the charged particle beam, can be reduced. One embodiment is shown in FIGS. 6a and 6b. FIG. 6a shows an electron width reduction system in the x-z-plane. The electrons are emitted by a source indicated by the circle 601. Electrons passing along the optical system (z-direction) form a divergent electron beam. The electron beam at first passes through the first electron selection element 618. Thereby, the beam is shaped. Thus, the first electron selection element, an aperture, is an angle depending selection element. Afterwards, the electron beam passes through the Wien filter element 110 and the quadrupole element 410. Therein, in the x-z-plane, electrons with a non-nominal energy are deflected due to the dispersion of the Wien filter. However, the focusing effect of the Wien filter element does not result in a limitation of the excitation of the Wien filter element and a corresponding limitation of the dispersion. This is caused by the fact that quadrupole element 410 compensates or at least partly compensates the focusing effect of the Wien filter element.

After passing through the combined Wien filter quadrupole system, parts of the electron beam are blocked by the electron selection element 616. The electron selection element 616, an aperture means with an opening, blocks electrons that are deflected so as not to pass through the opening of electron selection means 616.

Finally, the electron beam passes through the second Wien filter element 112 and the second quadrupole element 412. Thereby, again, the electrons are deflected based on dispersion, that is the deviation from the nominal energy. Nevertheless, again, the focusing effect of the Wien filter element does not result in a limitation of the excitation of the Wien filter element and a corresponding limitation of the dispersion since the quadrupole element 412 compensates or at least partly compensates the focusing effect of the Wien filter element.

Both Wien filter elements 110 and 410 deflect electrons dependent on the electron energy. Both Wien filter elements introduce dispersion. However, a charged particle with a certain energy that is deflected away from the optical axis in the first Wien filter 110 is deflected towards the optical axis in the second Wien filter 112. The dispersions introduced by the two Wien filters have an opposite sign. This aspect of the two dispersions of the two Wien filter elements acting in opposite directions with respect to each other may be applied to the subject invention independently of specific embodiments.

Resulting beam paths in the x-z-plane will now be described with respect to FIG. 6a. As can be seen, all beam paths 60, 61, and 62 are deflected in the first system including the Wien filter element 110 and the quadrupole element 410. Consequently, all beam paths shown in FIG. 6a have a non-nominal energy. Beam path 60 starts along the z-axis, that is the optical axis of the energy width reduction system. Due to the dispersion of the first Wien filter element, the electrons are deflected away from the optical axis. Within the second Wien filter element 112, electron beam 60 is deflected towards the optical axis. Thereby, the amount of deflection is adjusted so that the deflection of the first Wien filter element and the deflection of the second Wien filter element result in the beam path direction as if the electrons would have traveled along beam path 60'. Thus, beam path 60 seems to originate from the source 601.

The beam 61, as compared to beam 60, is not deflected in positive x-direction but in negative x-direction. Thus, in the event that the electrons of beam 60 would have a higher than the nominal energy, electrons of beam 61 would have an energy lower than the nominal energy. Independent thereof, the second Wien filter element 112 deflects the electrons of beam 61 so that they seem to follow along path 61'.

A further possible beam path is indicated with reference number 62. First Wien filter element 110 deflects electrons of beam pass 62 to an amount that the beam is blocked by electron selection element 616. This is indicated by the dashed line (62). If electrons are blocked by the selection element depends, on the one hand, on the dispersion dependent deflection of the first Wien filter element 110 and, on the other hand, on the size of the opening of selection element 618. This will be described in more detail with respect to FIG. 8b.

A path of possible beam paths in the y-z-plane will now be described with respect to FIG. 6b. The dipole Wien filters 110 and 112 do not influence the beam in the y-z-plane. This is indicated by the dotted lines of the respective components within FIG. 6b. However, the quadrupole elements 410 and 412 focus the charged particles in the y-z-plane. This can be explained as follows. In the x-z-plane (see FIG. 6a) the Wien filter elements act in a focusing and dispersive manner. Yet, the focusing effect of the Wien filter elements is compensated, at least partly, by a defocusing of the quadrupole elements in the x-z-plane. This results in an influence on the electrons in the x-z-plane that is merely dispersive. The quadrupole element that is defocusing in the x-z-plane is focusing in the y-z-plane. As can be seen from FIG. 6b, the first quadrupole element 410 and the second quadrupole element 412 are excited to result in the beam path, either 60a or 60b which seems to come from the electron source 601. Therefore, similarly to the x-z-plane, for all beam paths there is the virtual source, which is located at the position of source 601. The difference between the beam paths 60a and 60b is, that additional line foci are created. Generally, N additional line foci can be generated, whereby N>=1. For increasing N there is a higher excitation. The higher excitation of the quadrupole elements also leads to a higher excitation of the Wien filter elements that, in turn, results in an increased dispersion.

As will be explained in the following, the excitation of the quadrupole elements and the Wien filter elements correlate with each other and are such that a plurality of discrete values can be realized, whereby different dispersion levels can be utilized, as well.

Starting for example with beam pass 60a of FIG. 6b, the first quadrupole element 410 focuses the electron beam towards the optical axis (z-axis). The excitation of the second quadrupole element 412 is adjusted to have an offset of the particle beam and a slope of the particle beam with respect to the z-axis that the particle beam virtually comes from source 601. This is indicated by dotted line 60a'. The focusing of the first and the second quadrupole element in the y-z-plane result in a defocusing of the first and the second quadrupole element in the x-z-plane. However, in the x-z-plane, the first Wien filter element 110 and the second Wien filter element 112 act in the focusing manner on the electron beam. The first Wien filter element and the second Wien filter element are adjusted so that, after passing through the second Wien filter element 112, the charged particle beam has an offset from the z-axis and a slope with respect to the z-axis as if the particles would originate from the source 601. This is indicated by the dotted lines 60', 61' and 62'.

The excitation of the components, as described above, result in a dispersion of the two Wien filter elements. This dispersion of the electrons can be used to block parts of the electron beam depending on the energy.

Referring now to beam path 60b shown in FIG. 6b, the first quadrupole element 410 and the second quadrupole element 412 are excited to a higher level as compared to the excitation resulting in beam path 60a. Thereby, a crossover is generated within the quadrupole elements. However, as described above, the resulting beam path after the second quadrupole element 412 seems to originate from source 601, as indicated by dotted line 60b'.

The increased excitation of the quadrupole elements also results in an increased defocusing of the quadrupole element in the x-z-plane. Thus, the excitation levels of the two Wien filter elements which result in the desired beam path, that is the beam paths with a charged particle beam after the second Wien filter element 112 that seems to originate from source 601, are also higher. These higher excitation levels of the Wien filter elements result in increased dispersion as compared to the situation described above (beam path 60a). Consequently, there is a plurality of discrete values of excitation of the respective components, which result in different dispersion levels. Nevertheless, the excitation conditions have in common that in the x-z-plane as well as the y-z-plane the charged particles seem to originate from source 601.

That is, the above described imaging properties result in a virtually dispersive source 601. Thereby, even further, the dispersion of the Wien filter elements is not inherently limited by the focusing effect of the Wien filter elements since there is the additional defocusing of the quadrupole elements.

A further embodiment of the present invention will now be described respect to FIG. 7. Therein, the situation comparable to FIG. 6a is described. However, the electron selection element 616, which is position between the first Wien filter element 110 and the second Wien filter element 112 in FIG. 6a, is replaced by an electron selection element 716 behind the second Wien filter element 112. This arrangement might, for example, be advantageous if at electron selection element, that is an aperture means, is for constructional reasons better not positioned between the first Wien filter element 110 and the second Wien filter element 112. However, without any constructional limitations, the electron selection element can also be positioned between the two Wien filter elements.

Figure 7:
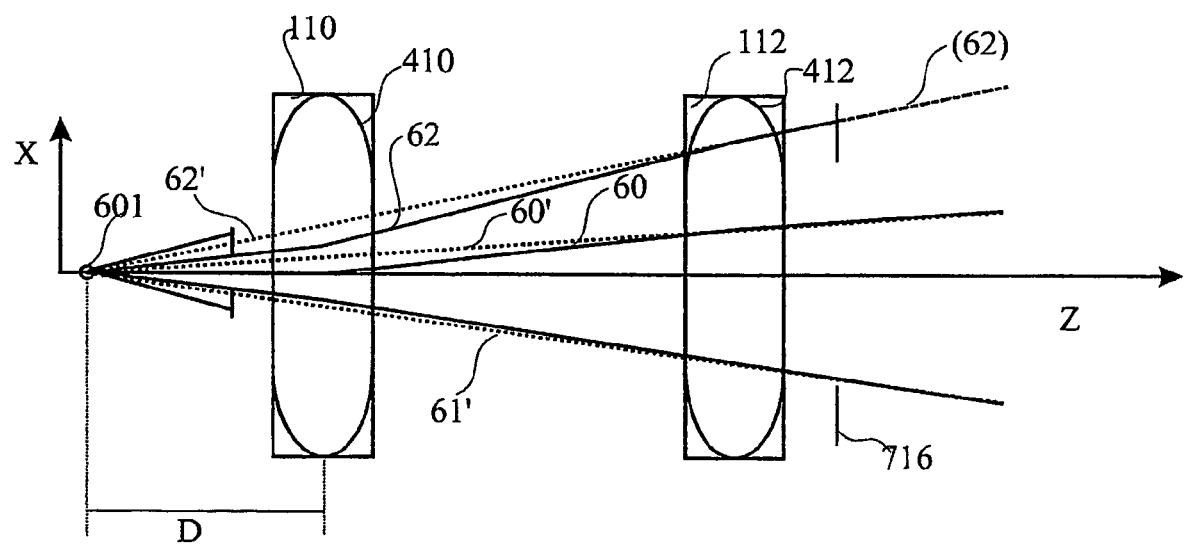
FIG. 7 shows a schematic side view in the x-z-plane of an embodiment of a charged particle beam energy width reduction system according to the present invention.

Above, with reference to FIG. 6 and FIG. 7, the embodiments referred to the electron source 601. However, independent of specific embodiments described within the present application, this source-like location can either be an electron source, a virtual electron source, a crossover, or an image of any of the three aforesaid possibilities, that is an image of an electron source, or an image of a virtual electron source.

Figure 8A:
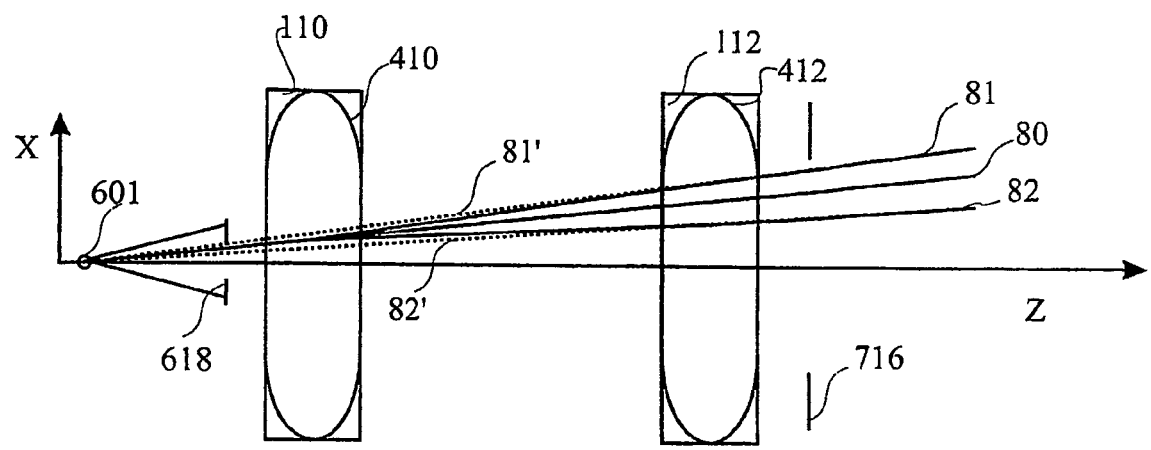
FIG. 8a shows a schematic side view in the x-z-plane of an embodiment of a charged particle beam energy width reduction system according to the present invention.

Further details regarding the dispersion of the electron beams are described with respect to FIG. 8a and FIG. 8b in the following. FIG. 8a shows an electron beam 80 with nominal energy. Typically, the first Wien filter element 110, the second Wien filter element 112, the first quadrupole element 410, and the second quadrupole element 412 are excited so that an electron beam with nominal energy is not deflected in the x-z-plane. Electron beams 81 and 82 have an energy deviating from the nominal energy. Thereby, one of these beams has an energy higher than the nominal energy and one of these beams has an energy lower than the nominal energy. Both electron beams 81 and 82 have the same beam path from the source 601 to the first Wien filter element 110 than the electron beam path 80 with the nominal energy. However, due to the deviation from the nominal energy, one of the beams is deflected in positive x-direction and one of the beams is deflected in negative x-direction.

Thus, electrons having originally the same beam path are deflected depending on their energy. The second Wien filter element 112 is excited so that, in both cases 81 and 82, the electrons are deflected energy dependently in a manner that the resulting electron path after the second Wien filter element 112 seems to originate from source 601.

Figure 8B:
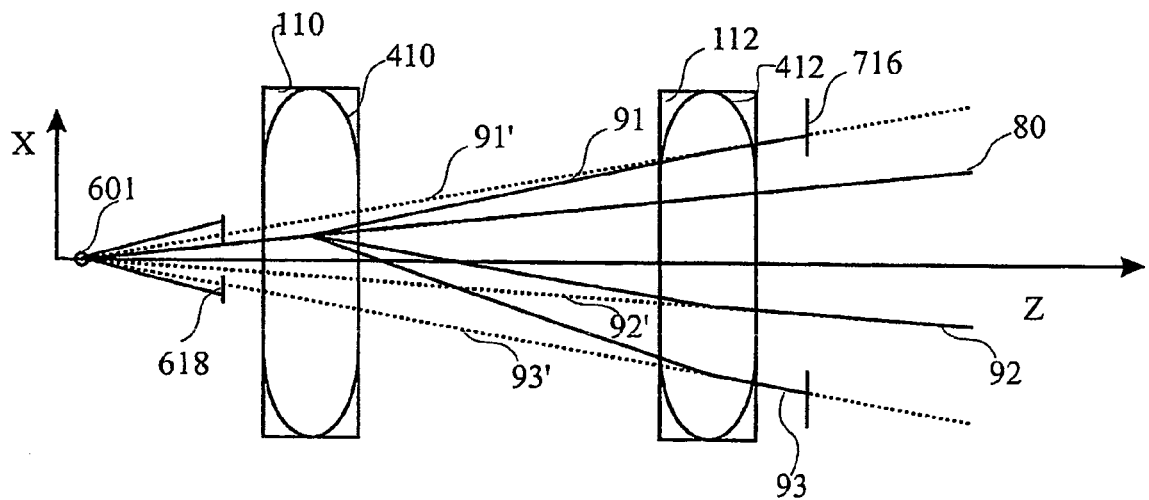
FIG. 8b shows a schematic side view in the x-z-plane of an embodiment of a charged particle beam energy width reduction system according to the present invention.

FIG. 8b shows a situation that is comparable to FIG. 8a. Again, first electron selection element 618 selects the electrons dependent on their energy. Thus, independently of the specific embodiment, the first selection element can be considered an angle dependent selection element. In FIG. 8b, besides the nominal energy beam path 80 beam paths 91, 92, and 93 with energies having a larger deviation from the nominal energy are shown. As can be seen, beam 91 deviates from the nominal energy to an amount that the electrons are blocked by electron selection element 716. Beam path 92, which is deflected to the opposite side as compared to beam 91 is not blocked by the electron selection element 716. A further exemplarily electron beam that is blocked by the second selection element is denoted as 93. As can be seen, electron selection element 716 is not only an energy dependent electron selection element, but the energy selection depends on the angle of the electron beam with respect to the optical axis. Thus, the second electron selection element is an energy dependent and angle dependent selection element.

These aspects of having a first charged particle selection element that is an angle dependent selection element and/or a second charged particle selection element that is an energy and angle dependent selection element can be combined with any embodiment shown in the present application.

Figure 9A:
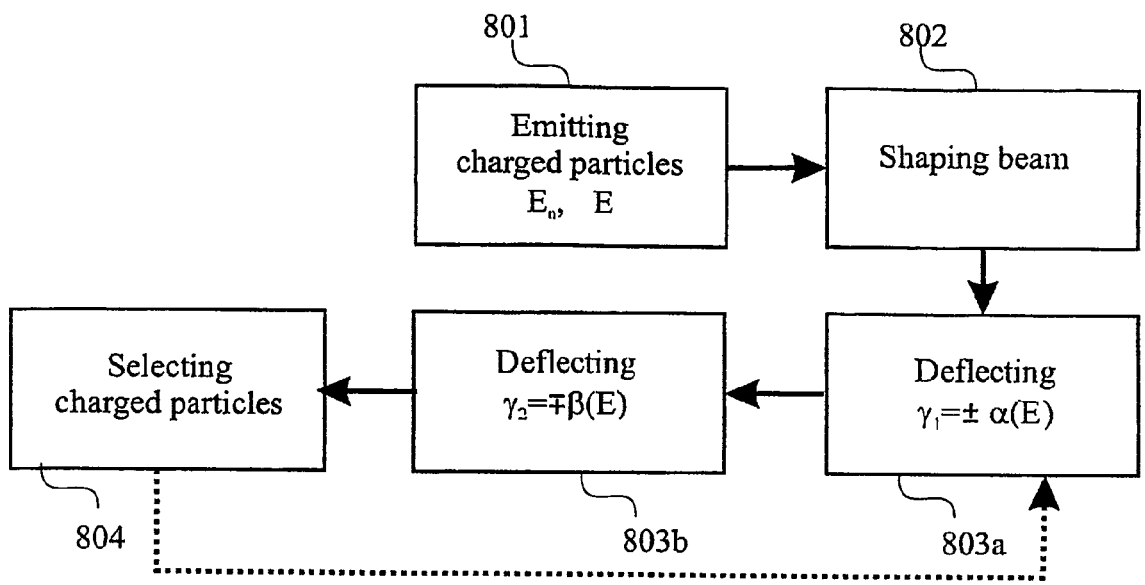
FIGS. 9a to 9b show flow charts of a method according to the present invention.

FIG. 9a shows a flowchart of a respective method. Method step 801 refers to the generation of charged particles. The charged particles are emitted and accelerated to the nominal energy $E_n$. Thereby, the electron beam has an energy width of $\Delta E$. The electrons, while passing through the optical column, pass through the energy width reduction system and are shaped by the first selection element 618 in step 802. Within the first Wien filter-quadrupole component, according to method step 803a, the electrons are deflected. The deflection angle is a function of the energy of the electrons $\alpha(E)$. The energy dependent deflection is e.g. conducted in positive x-direction. Further, within the second Wien filter-quadrupole component, according to method step 803b, the electrons are deflected. The deflection angle is a function of the energy of the electrons $\beta(E)$. The energy dependent deflection is e.g. conducted in negative x-direction. As indicated by the +− sign and the −+ sign, the deflection forces on a charged particle relating to $\gamma_1$ and the deflection forces on a charged particle relating to $\gamma_2$ for a particle with the same energy E act in opposite directions.

In step 804, the electrons are selected by the second (energy dependent) selection means. The described method refers to an assembly of the components as shown in FIG. 6a. In the case of an assembly of the components as shown in FIG. 7, step 804 is conducted before step 803b.

As indicated by the dotted arrow in FIG. 9a, the above-described method may be further expanded. After first deflection $\gamma_1(E)$ and $\gamma_2(E)$ and a corresponding charged particle selection, which corresponds to a first measurement mode, the deflection can be modified. The modified deflection can be used to control the charged particle beam current or the energy width (resolution respectively). Thus, the device can be operated in a second measurement mode or even further measurement modes due to modification of the charged particle deflection. Thereby, the charged particle selection elements do not need to be adjusted mechanically in order to realize different dispersions and thus different beam currents.

Figure 9B:
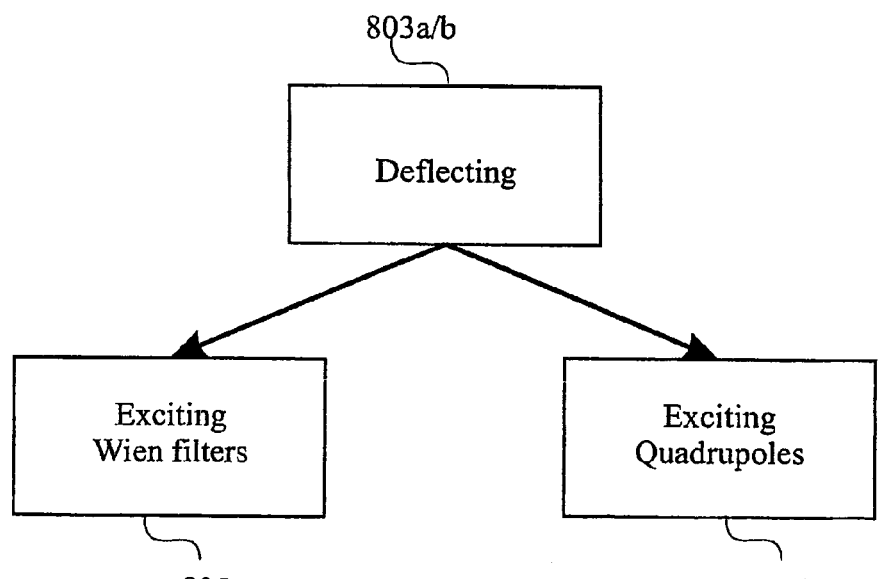

The method of operating the multiple in order to realize that deflection is described in FIG. 9b. Method steps 803a,b comprise essentially the following two steps. On the one hand, according to method step 805, the Wien filter elements are excited. On the other hand, according to method step 806, the quadrupole elements are excited so that in x-direction and in y-direction the virtual source of dispersion is positioned along the z-axis. Typically, the positioning would be conducted to have a source-like location of the charged particle beam and the virtual source of dispersion at the same z-position or at least close together. In addition, the source-like location can be positioned along the z-axis by the excitation of the two quadruples. The virtual source of dispersion may follow this positioning.

The above methods can be used to further increase the excitation and, thereby, the dispersion as compared to a Wien filter element with focusing properties. Further, additional crossovers in the x-z-plane and the y-z-plane at a common z-position can be avoided. Even further, a virtual enlargement of the source-like location as a result of dispersion can be avoided or at least significantly reduced.

FIGS. 10a to 10e show different examples of embodiments of the electron selection elements 616, 618 and 716. Thereby, the first and the second electron selection elements are drawn to be identical. However, the present invention is not limited thereto. It is preferred to have at least the sizes of the openings 706, 705 or 704 differ between the electron angle dependent selection element and the electron energy dependent selection element.

Without limiting the invention thereto, according to a typical embodiment, the first electron selection element and the second electron selection element have round apertures.

It is further possible, without limiting the invention thereto, that the first electron selection element has a round aperture, whereas the second electron selection element has a slit aperture. Alternatively, the first electron selection element has a round aperture, whereas the second electron selection element is provided by a selection edge, that is a knife edge, according to FIG. 10d or 10e.

Figure 10A:
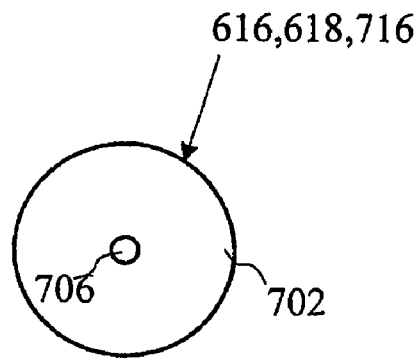
FIGS. 10a to 10e show schematic views of embodiments of electron selection elements.

FIG. 10a shows a disc element 702 with a round aperture 706. The beam is shaped by blocking the portion of the beam which impinges on the disc element 702. With respect to the second electron selection element, the electrons which are deflected energy-dependently in x-direction are partly blocked by the disc element 702 of the second energy dependent selection element. Thereby, the energy width of the electron beam can be reduced.

Figure 10B:
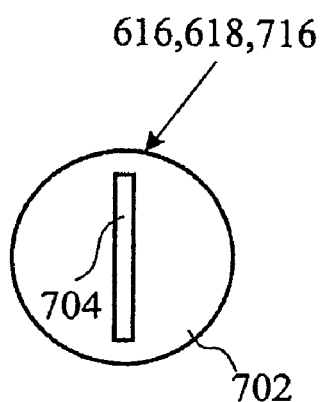

FIG. 10b shows a round disc element 702 with a slit aperture 704. Within the monochromator, the slit would extend in y-direction. Thereby, electrons with the nominal energy could pass through the center of the slit, independent of the displacement from the optical axis in y-direction. Non-nominal energy electrons would be deflected in x-direction and would thus be blocked by the disc element 702.

The slit aperture may for example be used to avoid contaminated regions of the slit. In the case where a region of the slit is contaminated, the electron selection element can be displaced in y-direction. Thereby, a different region of the slit aperture 704 may be used, which is not contaminated.

Figure 10C:
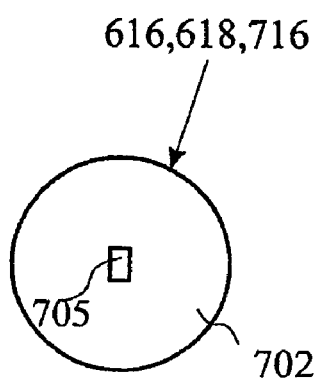

FIG. 10c shows an electron selection element 514/516 with a disc element 702 and a short slit 705. Slit 705 has a smaller extension in y-direction. Therefore, electrons which pass through the slit need to have less deviation from the optical axis in y-direction.

Figure 10D:
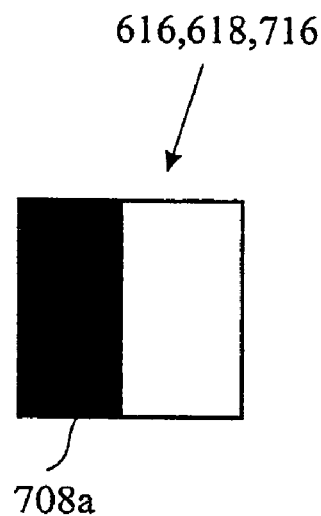
Figure 10E:
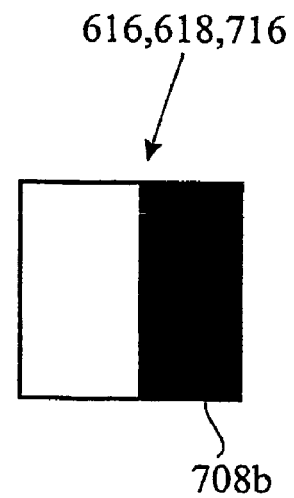

Further embodiments are described with respect to FIGS. 10d and 10e. All above described embodiments had at least an electron selection in positive x-direction and in negative x-direction. However, it is also possible to provide an electron selection means, a selection edge, that only blocks electrons deviating from the nominal beam path in one of either positive or negative x-direction. Thereby, only one edge limiting the electron beam is provided. The elements have a solid part 708a or 708b, respectively. All electrons passing on the right side of solid part 708a are not blocked. All electrons passing on the left side of solid part 708b are not blocked.

The components of FIGS. 10d and 10e can be used for different embodiments. Thereby, the components can be used separately or they can be combined. A first embodiment making use of one of the components of FIG. 10d or 10e will now be described. Depending on the side of the electron energy spectrum that should be blocked, either electron selection element of FIG. 10d or of FIG. 10e can be used. Nevertheless, an electron selection edge could only block a low-energy or a high-energy part of the electron energy spectrum. This might however be sufficient as will be described in the following.

As described with respect to the state of art, it is for example desirable to reduce the energy width of the primary electron beam. The energy width is thereby mainly influenced by the emitter characteristic. Consequently, the desired energy selection depends on the emitter characteristic. Some emitters, like Schottky emitters or cold-field emitters, have an asymmetric emitting spectrum. That is, the energy spectrum of the emitted electrons has a steep flank on one side of the emission peak, whereas on the other side of the peak, the spectrum has a tail-like shape. The tail-like shape of one side of the emission spectrum dominates the energy width $\Delta E$. Thus, in the case where the tail of the spectrum is blocked, the energy width $\Delta E$ can be sufficiently decreased. In view of the above, it can be sufficient to only use an edge to select electrons.

A second embodiment making use of both components of FIG. 10d and 10e will now be described. The two electron selection elements are positioned to be—in z-direction—neighboring elements. Thus, each element is used to select electrons depending on the deviation from nominal energy. By combining the two elements a slit comparable to slit 704 is formed. However, providing two separate components might be used because of easier maintenance, reduced tendency to contamination, or the like.

A third embodiment making use of both components of FIGS. 10d and 10e will now be described. The second embodiment described above can be diversified as follows. In the case, where two separate electron selection knife edges are used, each element can be adjusted independently of each other.

Describing the previously mentioned electron energy dependent selection elements no reference was made to any adjustment of the energy width $\Delta E$. The system described with respect to FIGS. 6a to 8b provides the opportunity to adjust the electron energy width $\Delta E$ by adjusting the width of the electron selection element 616,716 in x-direction. All embodiments described above might be equipped with aperture width variation means. Alternatively, electron selection elements, each having fixed aperture width, might be exchangeable in order to select the electron energy width.

According to further embodiments (not shown) the electron selection elements might alternatively or additionally be movable.

The currently described embodiment referring to FIGS. 10d and 10e provides the opportunity to more easily adjust the edges of the electron selection elements and, further still, to easily adjust the selection elements independently of each other.

However, since the present invention allows adjusting the dispersion within the system as a result of different excitation of the Wien filter elements, whereby additionally the charged particle beam paths in the x-z-plane are not varied, an adjustment of the energy selection elements is optional and is not required for energy width adjustment as it is the case in many prior art systems.

Figure 11A:
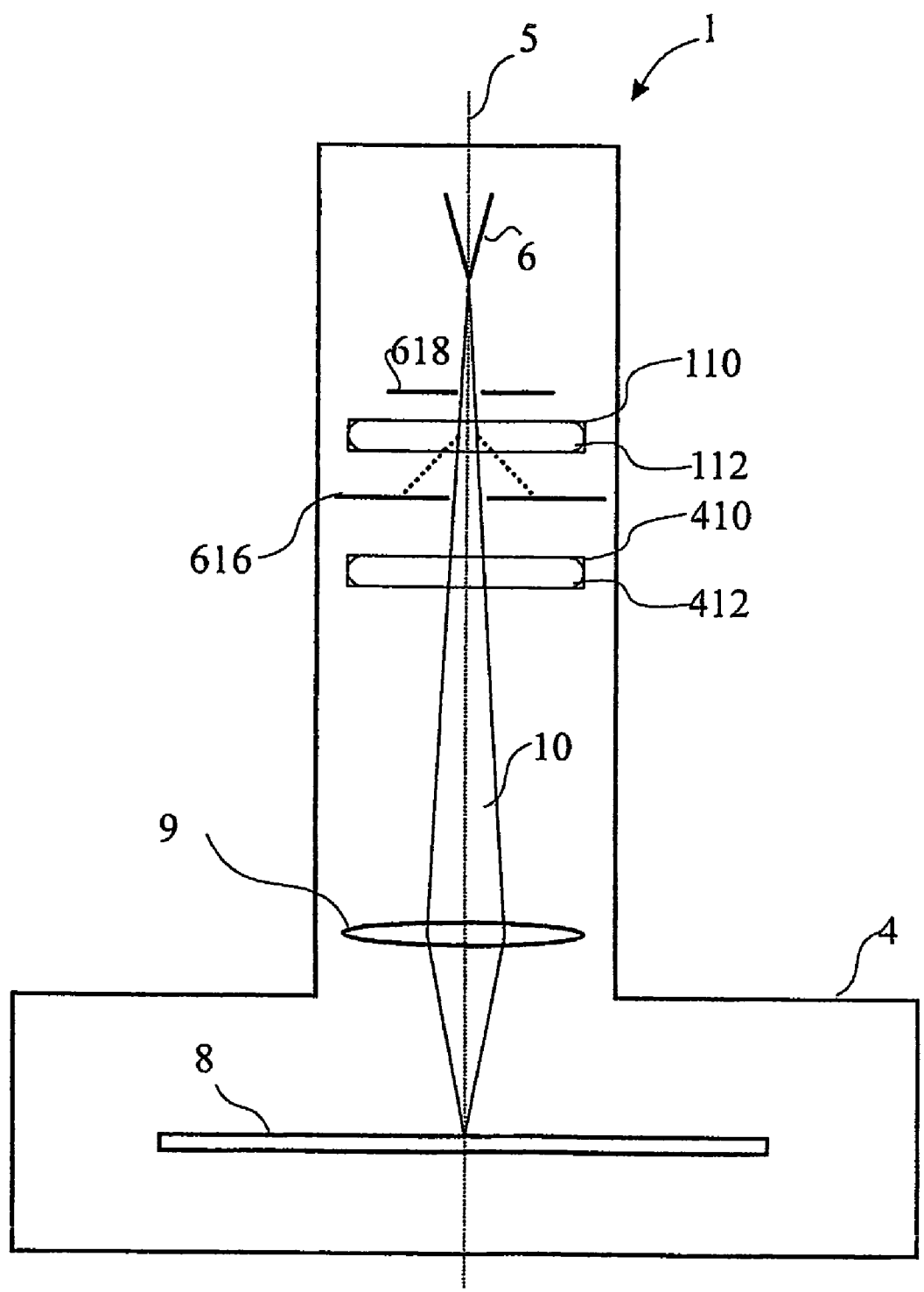
FIG. 11a shows a schematic side view of an embodiment of a charged particle beam device according to the present invention.

Exemplary embodiments of a charged particle beam device making use of the above described energy width reduction system will be described with respect to FIG. 11a and FIG. 11b in the following. FIG. 11a shows a charged particle beam device 1. The device comprises an electron column and a specimen chamber. The electron column has a housing 3, whereas the specimen chamber has a housing 4. The respective areas can be evacuated by means of vacuum pumps (not shown).

Within the electron column, electron source 6 emits electrons essentially along optical axis 5. The electrons pass through the system along beam path 10 and are focused by objective lens 9 on specimen 8. In order to improve the resolution of the system by decreasing the chromatic aberrations of e.g. the objective lens, the energy width of the emitted electrons is reduced. Therefore, the electron beam is shaped by aperture means 618. The shaped beam enters the first Wien filter quadrupole element system 110/412. Electrons with a nominal energy pass essentially straight through this Wien filter quadrupole element system. Electrons with an energy deviating from the nominal energy are deflected by the dispersion of this first system. Thus, electrons with a deviation above a certain limit are blocked by aperture means 616, that is electron selection element 616. Nevertheless, some electrons deviating from the nominal energy within a certain limit can pass through the opening of electron selection element 616 in spite of the non-nominal energy. In order to correct to the deflection introduced by the first Wien filter 110 and the first quadrupole 410, these electrons are deflected by the second Wien filter element 112 in the second quadrupole element 412 in a manner so that they seem to originate from the electron source 6. In view of the above described energy selection, the energy width of the electron beam 10 is reduced. Thus the chromatic aberrations of the system are reduced and the resolution is improved.

Figure 11B:
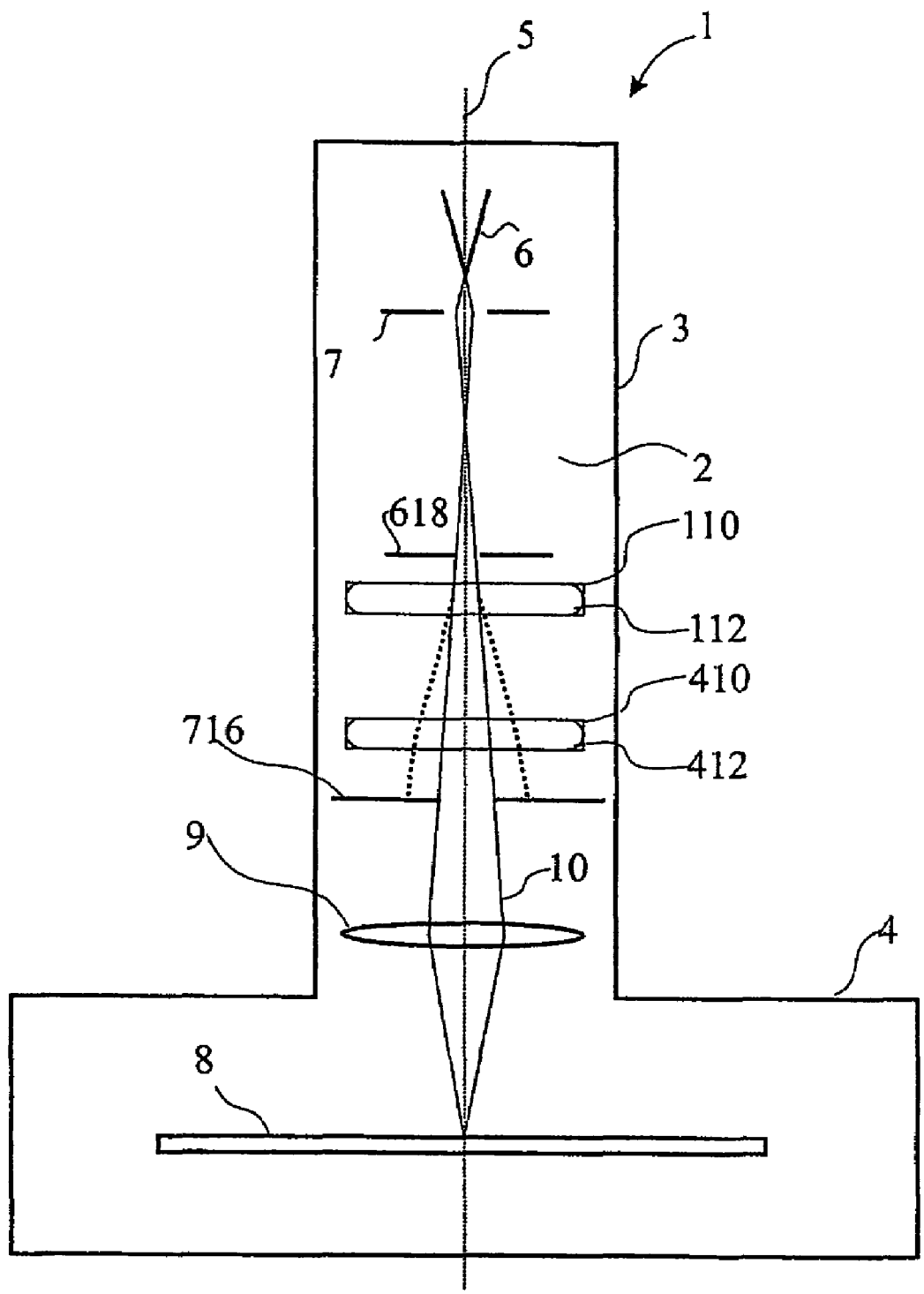
FIG. 11b shows a schematic side view of an embodiment of a charged particle beam device according to the present invention.

A further example of a charged particle beam device 1 is shown in FIG. 11b. Thereby, anode lens 7 generates a crossover thereafter. Beam path 10, which is again focused by objective lens on specimen 8, passes through an energy width reduction system after this crossover. This crossover acts like a source-like location as defined above. First Wien filter element 110 and first quadrupole element 410 act in combination in a mainly dispersive manner, that is the focusing effect of the Wien filter element is mainly compensated by the defocusing of the quadrupole element. Thereby, the excitation of the Wien filter element can be increased to an amount beyond the inherent limitation of dispersion for the charged particles due to the focusing effect of regular dipole Wien filters. Consequently, the dispersion can be further increased which results in a further increase of the energy width reduction.

The second Wien filter element 112 and the second quadrupole element 412 deflect the electrons so that they seem to originate from the crossover generated by the anode lens. Finally, electrons deviating from a nominal energy beyond a certain limit are blocked by electron selection element 716.

Within FIG. 11b, on the one hand, the source-like location of the electron beam varied with respect to FIG. 11a and, on the other hand, the energy dependent selection element moved from in between the two Wien filter elements to after the second Wien filter element. However, these to independent details of the present invention can be independently combined with any embodiment described above.

The energy width reduction systems described above can be used to advantageously reduce the energy width of charged particle beams, either for primary charged particle beams as shown in FIG. 11a and FIG. 11b or for secondary charged particle beams released from a specimen or a like, by compensating the focusing effect of the dipole Wien filter and avoiding a crossover in the x-z-plane and the y-z-plane at a common z-position in the energy width reduction system, that is an additional crossover in the optical system can be avoided. Thereby, on the one hand, an inherent dispersion limit of dipole Wien filters can be overcome and the virtual source of dispersion can be moved to the source like location, like the charged particle source, the virtual charged particle source, a crossover or an image of any of these three.

The invention claimed is:

1. A charged particle beam velocity distribution width reduction system for a charged particle beam with the z-axis extending along the optical axis, comprising:
   a first element acting in a focusing and dispersive manner, the first element acting in a focusing and dispersive manner being a first Wien filter element;
   a second element acting in a focusing and dispersive manner, the second element acting in a focusing and dispersive manner being a second Wien filter element;
   a first quadrupole element being positioned such that, in operation, a field of the first quadrupole element overlaps with a field of the first element acting in a focusing and dispersive manner, wherein the first quadrupole element is adapted for at least partly compensating the focusing effect of the first Wien filter element;
   a second quadrupole element being positioned such that, in operation, a field of the second quadrupole element overlaps with a field of the second element acting in a focusing and dispersive manner, wherein the second quadrupole element is adapted for at least partly compensating the focusing effect of the second Wien filter element;
   a first charged particle selection element being positioned, in beam direction, before the first element acting in a focusing and dispersive manner, wherein the first charged particle selection element is adapted to be an angle dependent charged particle selection element; and
   a second charged particle selection element being positioned, in beam direction, after the first element acting in a focusing and dispersive manner, wherein the second charged particle selection element is adapted to be a velocity dependent selection element, wherein the first element acting in a focusing and dispersive manner and the second element acting in a focusing and dispersive manner are built, connected, or both, to a control unit so that different absolute values of dispersion are realized.

2. The charged particle beam velocity distribution width reduction system according to claim 1, wherein the charged particle beam velocity distribution width reduction system comprises a charged particle beam energy width reduction system.

3. The charged particle beam velocity distribution width reduction system according to claim 1, wherein the charged particle beam velocity distribution width reduction system comprises a charged particle beam mass selection system.

4. The charged particle beam velocity distribution width reduction system according to claim 1, wherein the first element acting in a focusing and dispersive manner and the second element acting in a focusing and dispersive manner are built and/or connected to a control unit, so that dispersive forces act essentially in opposite directions.

5. The charged particle beam velocity distribution width reduction system according to claim 1, wherein the first element acting in a focusing and dispersive manner and the second element acting in a focusing and dispersive manner act in a focusing and dispersive manner in a first plane being an x-z-plane, and wherein the second selection element is positioned to select the charged particles at a position without a crossover in the first plane.

6. The charged particle beam velocity distribution width reduction system according claim 1, wherein the second charged particle selection element is positioned between the first element acting in a focusing and dispersive manner and the second element acting in a focusing and dispersive manner.

7. The charged particle beam velocity distribution width reduction system according to claim 1, wherein the second charged particle selection element is positioned, in beam direction, after the entrance of the second element acting in a focusing and dispersive manner.

8. The charged particle beam velocity distribution width reduction system according to claim 1, further comprising a charged particle source or a virtual particle source as a source-like location.

9. The charged particle beam velocity distribution width reduction system according to claim 1, further comprising a crossover as a source-like location.

10. The charged particle beam velocity distribution width reduction system according to claim 1, further comprising an image of a charged particle source or a virtual source as a source-like location.

11. The charged particle beam velocity distribution width reduction system according to claim 1, wherein the velocity dependent selection element is an energy dependent selection element.

12. The charged particle beam velocity distribution width reduction system according to claim 1, wherein the velocity dependent selection element is a mass dependent selection element.

13. The charged particle beam velocity distribution width reduction system according to claim 1, wherein the second charged particle selection element is a velocity dependent and angle dependent selection element.

14. The charged particle beam velocity distribution width reduction system according to claim 13, wherein the velocity dependent and angle dependent selection element is an energy dependent and angle dependent selection element.

15. The charged particle beam velocity distribution width reduction system according to claim 13, wherein the velocity dependent and angle dependent selection element is a mass dependent and angle dependent selection element.

16. The charged particle beam device comprising a velocity distribution width reduction system according to claim 1.

17. The charged particle beam device according to claim 16, wherein the first element acting in a focusing and dispersive manner is directly subsequent to a charged particle gun component, which comprises a charged particle source.

18. The charged particle beam device according to claim 16, wherein the first element acting in a focusing and dispersive manner is included in a gun component, which comprises the charged particle source.

19. A charged particle beam velocity distribution width reduction system positioned prior to an objective lens for a charged particle beam with the z-axis extending along the optical axis, comprising:
 a first element acting in a focusing and dispersive manner, the first element acting in a focusing and dispersive manner being a first Wien filter element;
 a second element acting in a focusing and dispersive manner, the second element acting in a focusing and dispersive manner being a second Wien filter element;
 a first quadrupole element being positioned such that, in operation, a field of the first quadrupole element overlaps with a field of the first element acting in a focusing and dispersive manner, wherein the first quadrupole element is adapted for at least partly compensating the focusing effect of the Wien filter element;
 a second quadrupole element being positioned such that, in operation, a field of the second quadrupole element overlaps with a field of the second element acting in a focusing and dispersive manner, wherein the second quadrupole element is adapted for at least partly compensating the focusing effect of the Wien filter element;
 a first charged particle selection element being positioned, in beam direction, before the first element acting in a focusing and dispersive manner, wherein the first charged particle selection element is adapted to be an angle dependent charged particle selection element; and
 a second charged particle selection element being positioned, in beam direction, after the first element acting in a focusing and dispersive manner, wherein the second charged particle selection element is adapted to be a velocity dependent selection element wherein the first element acting in a focusing and dispersive manner and the second element acting in a focusing and dispersive manner are built, connected, or both, to a control unit so that different absolute values of dispersion are realized.

20. The system according to claim 19, wherein the charged particle beam velocity distribution width reduction system comprises a charged particle beam energy width reduction system.

21. The system according to claim 19, wherein the charged particle beam velocity distribution width reduction system comprises a charged particle beam mass selection system.

22. The charged particle beam velocity distribution width reduction system according to claim 19, wherein the first element acting in a focusing and dispersive manner and the second element acting in a focusing and dispersive manner act in a focusing and dispersive manner in a first plane being an x-z-plane, and wherein the second selection element is positioned to select the charged particles at a position without a crossover in the first plane.

23. The charged particle beam device comprising a velocity distribution width reduction system according to claim 19.

24. The charged particle beam device according to claim 23 wherein the first element acting in a focusing and dispersive manner is directly subsequent to a charged particle gun component, which comprises a charged particle source.

25. The charged particle beam device according to claim 23, wherein the first element acting in a focusing and dispersive manner is included in a gun component, which comprises the charged particle source.

26. A method of operating a charged particle beam velocity distribution width reduction system comprising a z-axis along an optical axis, a first element acting in a focusing and dispersive manner being a first Wien filter element, a second element acting in a focusing and dispersive manner being a second Wien filter element, a first quadrupole element and a second quadrupole element, comprising:
 shaping the charged particle beam with a first charged particle selection element;
 exciting the first and the second quadrupole element so that the field of the first quadrupole element and the field of the second quadrupole element image in a y-z-plane a source-like location in a virtual manner;
 exciting the first element acting in a focusing and dispersive manner and the second element acting in a focusing and dispersive manner so that, in an x-z plane, the charged particles seem to originate from a source-like location by the combination of a field of the first element acting in a focusing and dispersive manner, a first quadrupole element field, a field of the second element acting in a focusing and dispersive manner, and a second quadrupole element field; and
 selecting velocity dependently the charged particles with the second charged particle selection element.

27. The method according to claim 26, wherein the charged particle beam velocity distribution width reduction system comprises a charged particle beam energy width reduction system; and the selecting with the second charged particle selection element is energy dependently.

28. The method according to claim 26, wherein the charged particle beam velocity distribution width reduction system comprises a charged particle beam mass selection system; and the selecting with the second charged particle selection element is mass dependently.

29. The method of operating a charged particle beam velocity distribution width reduction system according to claim 26, wherein the first and the second quadrupole elements and the first and the second elements acting in a focusing and dispersive manner are excited to one of a plurality of discrete values.

30. The method of operating a charged particle beam velocity distribution width reduction system according to claim 29, wherein the first and the second quadrupole elements and the first and the second elements acting in a focusing and dispersive manner are excited to have a virtual source of dispersion at the source-like location.

31. The method of operating a charged particle beam velocity distribution width reduction system according to claim 30, wherein the first and the second quadrupole elements are excited to position the virtual image of the source-like location along the z-axis.

32. The method of operating a charged particle beam velocity distribution width reduction system according to claim 26, wherein the first element acting in a focusing and dispersive manner is excited to generate a first dispersion and the second element acting in a focusing and dispersive manner is excited to generate a second dispersion with a different absolute value than the first dispersion.

33. The method of operating a charged particle beam velocity distribution width reduction system according to claim 32, wherein the first element acting in a focusing and dispersive manner is excited to generate a first dispersion and the second element acting in a focusing and dispersive manner is excited to generate a second dispersion, so that the forces of the second dispersion act in an essentially opposite direction to the forces of the first dispersion.

* * * * *

UNITED STATES PATENT AND TRADEMARK OFFICE
CERTIFICATE OF CORRECTION

PATENT NO. : 7,679,054 B2
APPLICATION NO. : 10/571347
DATED : March 16, 2010
INVENTOR(S) : Frosien et al.

It is certified that error appears in the above-identified patent and that said Letters Patent is hereby corrected as shown below:

Column 3, Line 62, please delete "exploration" and insert --explanation-- therefor;

Column 12, Line 47, please delete "multiple" and insert --multipole-- therefor;

Column 12, Line 59, please delete "quadruples" and insert --quadrupoles-- therefor.

Signed and Sealed this

Thirteenth Day of July, 2010

David J. Kappos
*Director of the United States Patent and Trademark Office*